(12) United States Patent
Xu

(10) Patent No.: US 7,580,263 B2
(45) Date of Patent: Aug. 25, 2009

(54) HEAT DISSIPATION DEVICE WITH A FAN HOLDER

(75) Inventor: Hong-Bo Xu, Shenzhen (CN)

(73) Assignees: Hong Fu Jin Precision Industry (ShenZhen) Co., Ltd., Shenzhen, Guangdong Province (CN); Hon Hai Precision Indsutry Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 11/967,072

(22) Filed: Dec. 29, 2007

(65) Prior Publication Data

US 2009/0168350 A1    Jul. 2, 2009

(51) Int. Cl.
*H05K 7/20* (2006.01)

(52) U.S. Cl. ............ 361/703; 361/697; 361/704; 361/719; 165/104.33; 257/E23.084

(58) Field of Classification Search ......... 361/697–704; 165/80.3, 104.33, 185, 122; 257/E23.099, 257/715, 718–719; 174/15.2, 16.3
See application file for complete search history.

(56) References Cited

U.S. PATENT DOCUMENTS

| | | | | |
|---|---|---|---|---|
| 5,936,836 | A * | 8/1999 | Scholder | 361/695 |
| 6,542,364 | B2 * | 4/2003 | Lai et al. | 361/697 |
| 6,556,442 | B2 * | 4/2003 | Lin | 361/697 |
| 6,717,814 | B2 * | 4/2004 | Li | 361/704 |
| 6,768,641 | B2 * | 7/2004 | Li | 361/719 |
| 6,938,682 | B2 * | 9/2005 | Chen et al. | 165/104.33 |
| 6,940,716 | B1 * | 9/2005 | Korinsky et al. | 361/695 |
| 7,156,158 | B2 * | 1/2007 | Ueda et al. | 165/104.21 |
| 7,180,740 | B2 * | 2/2007 | Li et al. | 361/697 |
| 7,228,889 | B1 * | 6/2007 | Tian et al. | 165/122 |
| 7,248,476 | B2 * | 7/2007 | Holmes et al. | 361/695 |
| 7,256,997 | B2 * | 8/2007 | Chen et al. | 361/697 |
| 7,277,281 | B1 * | 10/2007 | Lu et al. | 361/695 |
| 7,414,841 | B2 * | 8/2008 | Chen et al. | 361/697 |
| 2005/0087329 | A1 * | 4/2005 | Zhang et al. | 165/104.33 |
| 2006/0137861 | A1 * | 6/2006 | Wang et al. | 165/104.33 |
| 2006/0238979 | A1 * | 10/2006 | Liu | 361/699 |
| 2007/0035926 | A1 * | 2/2007 | Xia et al. | 361/695 |
| 2007/0121301 | A1 * | 5/2007 | Tan et al. | 361/719 |
| 2007/0151711 | A1 * | 7/2007 | Chen et al. | 165/104.33 |

* cited by examiner

*Primary Examiner*—Jayprakash N Gandhi
*Assistant Examiner*—Courtney Smith
(74) *Attorney, Agent, or Firm*—Frank R. Niranjan

(57) ABSTRACT

A heat dissipation device includes a heat sink assembly, a fan holder and two fans mounted on the two sides of the fan holder. The heat sink assembly includes a heat spreader for contacting with a heat-generating electronic component, and a fin assembly thermally connecting with the heat spreader. The fin assembly has a plurality of channels therein. The fan holder includes a top plate mounted on a top of the fin assembly and a pair of vertical baffle walls extending from two opposite ends of the top plate. The baffle walls of the fan holder are located at two lateral ends of the fin assembly and sandwich the fin assembly therebetween. The two fans respectively abut against inlets and outlets of the channels of the fin assembly. An airflow generated by one fan flows through the fin assembly and is sucked by the other fan.

6 Claims, 4 Drawing Sheets

000# HEAT DISSIPATION DEVICE WITH A FAN HOLDER

BACKGROUND OF THE INVENTION

1. Field of the Invention

The present invention generally relates to heat dissipation devices, and more particularly to a heat dissipation device having a fan holder for cooling an electronic component, such as an integrated circuit package.

2. Description of Related Art

Electronic components, such as central processing units (CPUs), comprise numerous circuits operating at high speed and generating substantial heat. Under most circumstances, it is necessary to cool the CPUs in order to maintain safe operating conditions and assure that the CPUs function properly and reliably. In the past, various approaches have been used to cool electronic components. Typically, a heat dissipation device is attached to an outer surface of a CPU to remove the heat therefrom.

A typical heat dissipation device generally comprises a heat sink for absorbing heat from an electronic component mounted on a fan mounted on the heat sink. An airflow generated by the fan flows through the heat sink to help a quick removal of the heat from the heat sink. However, the airflow will flow to exterior of the heat sink quickly and the heat in the heat sink cannot be timely dissipated.

Accordingly, what is needed is a heat dissipation device which overcomes the above-mentioned problems and shortcomings is desired.

SUMMARY OF THE INVENTION

According to an embodiment of the present invention, a heat dissipation device includes a heat sink assembly, a fan holder and two fans mounted on the two sides of the fan holder. The heat sink assembly includes a heat spreader for contacting with a heat-generating electronic component, and a fin assembly thermally connecting with the heat spreader. The fin assembly has a plurality of channels therein. The fan holder includes a top plate mounted on a top of the fin assembly and a pair of vertical baffle walls extending from two opposite ends of the top plate. The baffle walls of the fan holder are located at two lateral ends of the fin assembly and sandwich the fin assembly therebetween. The two fans respectively abut against inlets and outlets of the channels of the fin assembly. An airflow generated by one fan flows through the fin assembly and is sucked by the other fan.

Other advantages and novel features will become more apparent from the following detailed description of preferred embodiment when taken in conjunction with the accompanying drawings.

BRIEF DESCRIPTION OF THE DRAWINGS

Many aspects of the present heat dissipation device can be better understood with reference to the following drawings. The components in the drawings are not necessarily drawn to scale, the emphasis instead being placed upon clearly illustrating the principles of the present heat dissipation device. Moreover, in the drawings, like reference numerals designate corresponding parts throughout the several views.

DETAILED DESCRIPTION OF THE INVENTION

Figure 1:
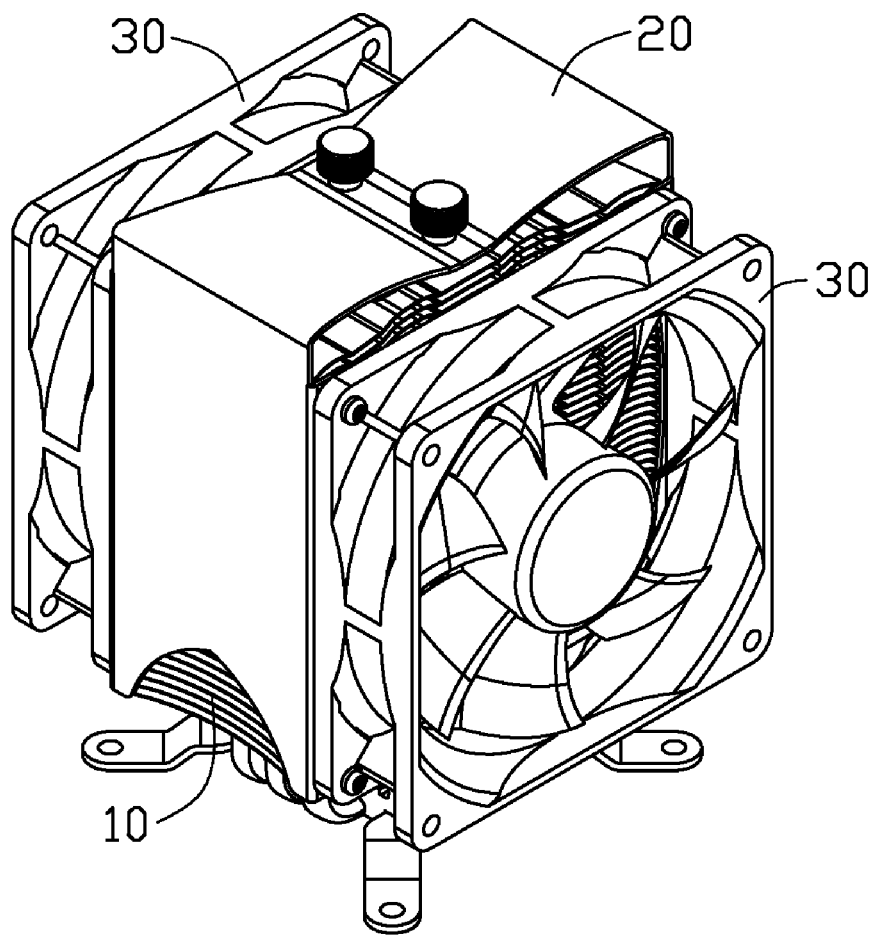
FIG. 1 is an assembled, isometric view of a heat dissipation device in accordance with a preferred embodiment of the present invention.
Figure 2:
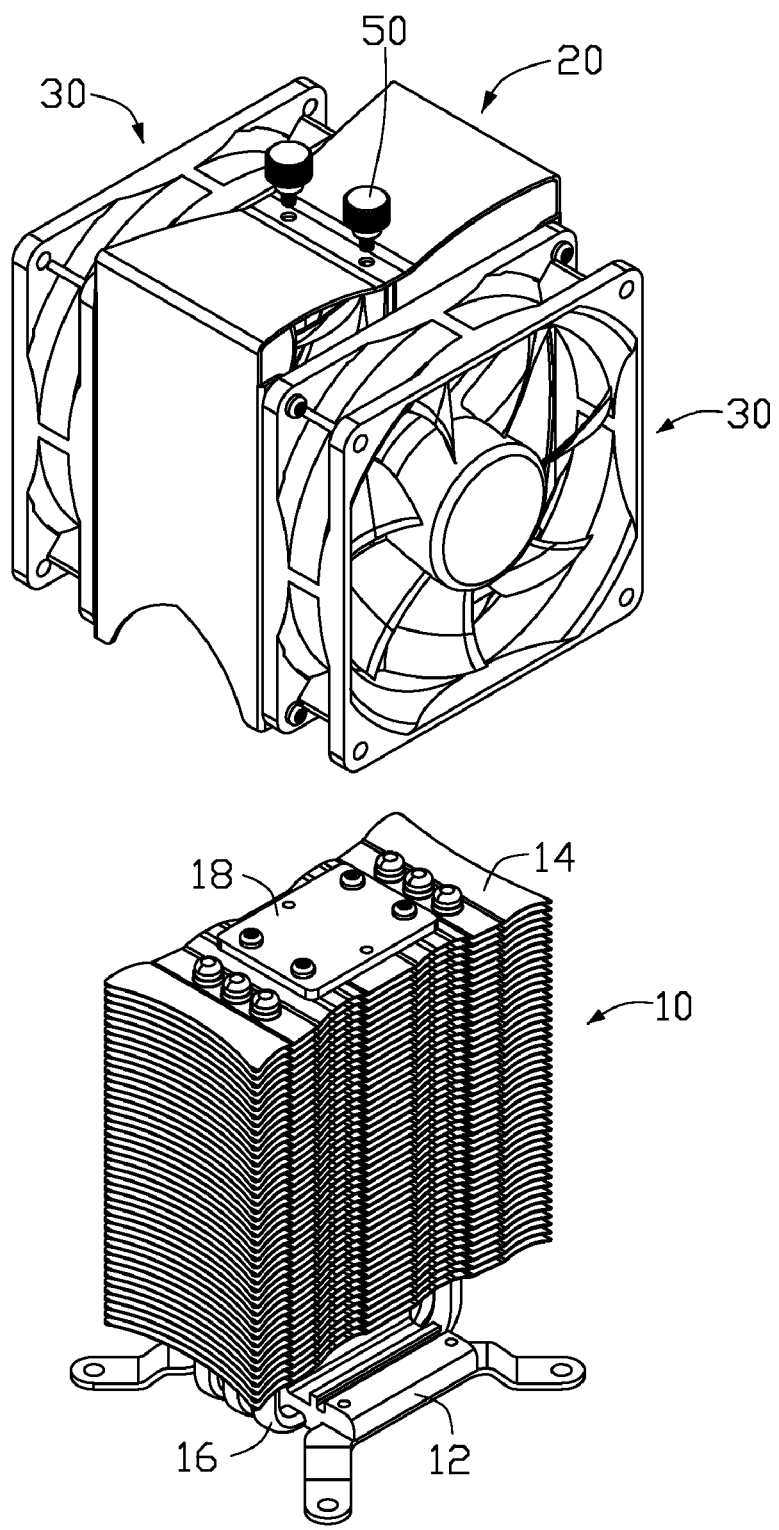
FIG. 2 is a partially assembled, isometric view of the heat dissipation device of FIG. 1.

Referring to FIGS. 1-2, a heat dissipation device in accordance with a preferred embodiment of the present invention is shown. The heat dissipation device is for being mounted to a printed circuit board (not shown) to remove heat from a heat-generating electronic component 60 mounted on the printed circuit board, such as a CPU. The heat dissipation device comprises a heat sink assembly 10 for contacting the CPU, a fan holder 20 mounted on the heat sink assembly 10 and two fans 30 secured on the fan holder 20.

Figure 3:
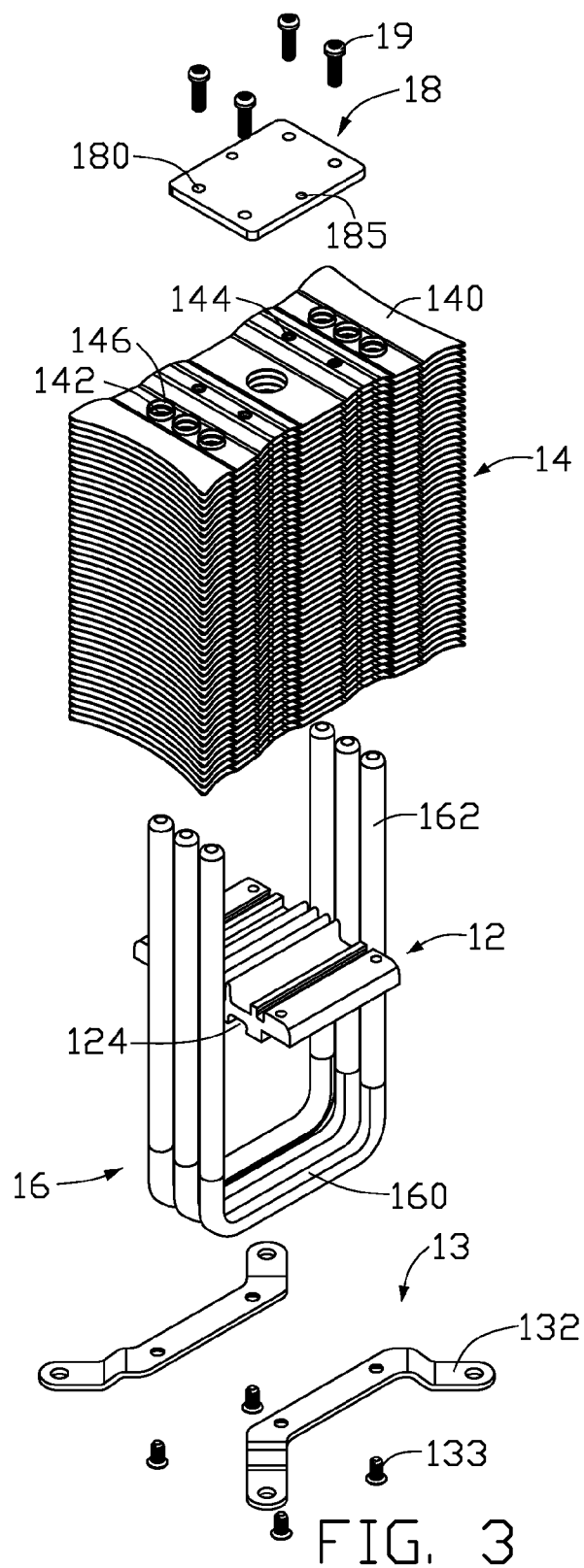
FIG. 3 is an explored, isometric view of a heat sink assembly of the heat dissipation device of FIG. 2.

Referring to FIG. 3, the heat sink assembly 10 comprises a heat spreader 12, a fin assembly 14, three parallel U-shaped heat pipes 16 thermally connecting the heat spreader 12 and the fin assembly 14, and a mounting plate 18 mounted on the fin assembly 14.

The heat spreader 12 has a rectangular configuration. The heat spreader 12 has a bottom face (not labeled) for contacting the CPU to absorb heat therefrom. The heat spreader 12 defines three grooves 124 at the bottom thereof. Two mounting brackets 13 each with a pair of ears 132 are attached to opposite bottom sides of the heat spreader 12 via four screws 133 extending through the mounting brackets 13 to engage with the heat spreader 12. The heat spreader 12 thermally engages with the CPU mounted on the printed circuit board by bringing four fasteners (not shown) to extend through the four ears 132 to threadedly engage with a retainer (not shown) attached to a bottom side of the printed circuit board.

Each heat pipe 16 comprises a horizontal evaporation portion 160 and a pair of vertical condensation portions 162 parallel to each other. The condensation portions 162 extend from two opposite ends of the evaporation portion 160. The evaporation portions 160 of the heat pipes 16 are soldered in the grooves 124 of the heat spreader 12. Bottom faces (not labeled) of the evaporation portions 160 are coplanar with the bottom face of the heat spreader 12 for cooperatively contacting the CPU. The condensation portions 162 upwardly extend through the fin assembly 14.

The fin assembly 14 consists of a plurality of parallel fins 140. Each fin 140 has a slightly waved configuration and is approximately parallel to the heat spreader 12. The fins 140 are perforated with three pairs of through holes 142, corresponding to the condensing portions 162 of the three heat pipes 16. Each of the through holes 142 has its respective annular sidewall 146 that is formed during punching of its respective through hole 142. The condensing portions 162 of the heat pipes 16 are received in the through holes 142 and soldered to the sidewalls 146 so that the fins 140 are combined with the condensation portions 162 of the heat pipes 16 and form a plurality of horizontal channels (not labeled) therebetween. Each fin 140 defines four through holes 144 between the through holes 142.

The mounting plate 18 has a rectangular configuration and is smaller than the heat spreader 12. The mounting plate 18 defines four through holes 180 in four corners (not labeled) thereof, corresponding to the through holes 144 of the fin assembly 14. Four screws 19 extend through the mounting plate 18 and are engaged in the through holes 144 of the fins 140. The mounting plate 18 defines two thread holes 185 in the central portion thereof.

Figure 4:
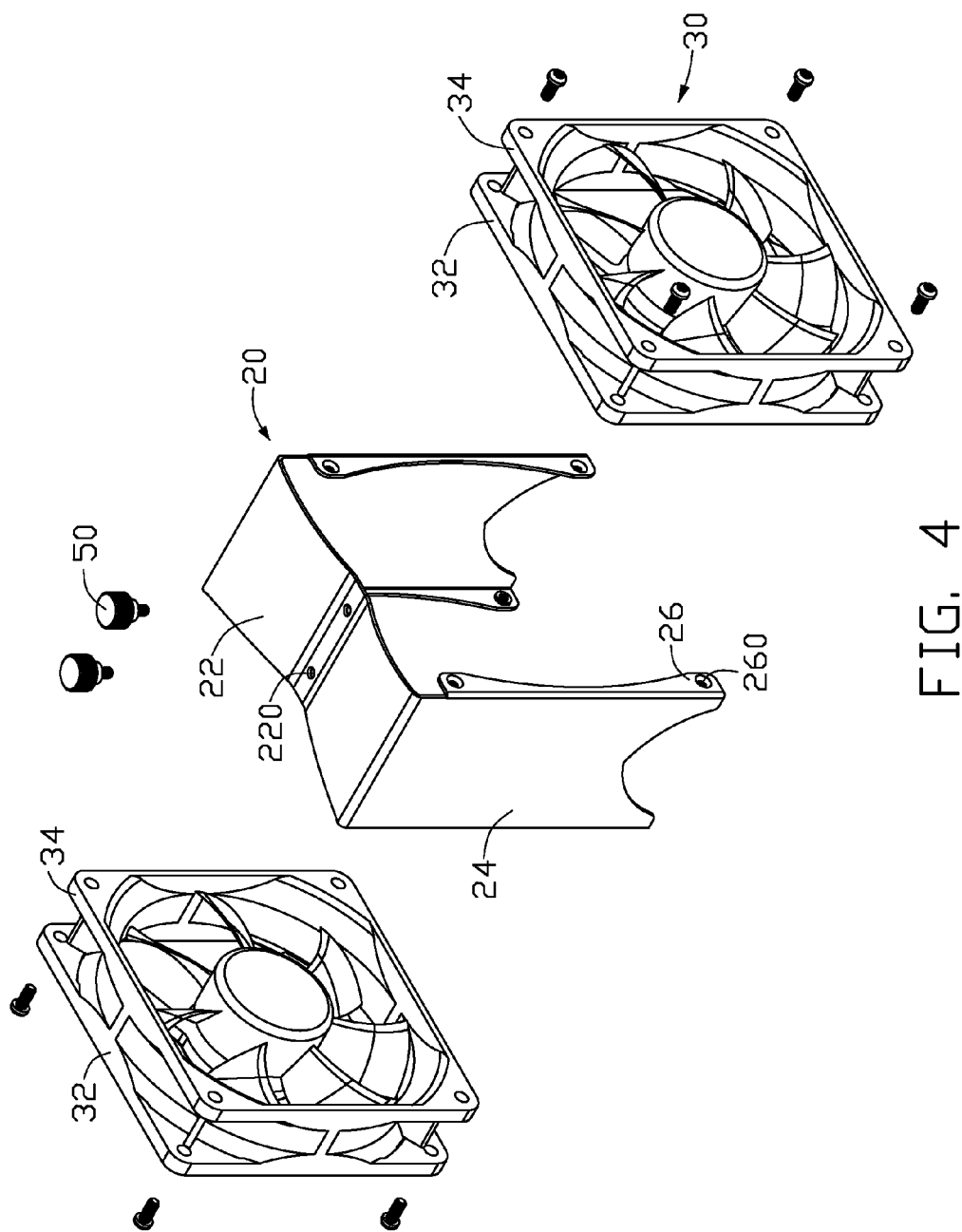
FIG. 4 is an explored, isometric view of fans and a fan holder of the heat dissipation device of FIG. 2.

Referring to FIG. 4, the fan holder 20 has an inverted U-shaped configuration, consisting of a top plate 22 and a pair of vertical baffle walls 24 parallel to each other. The top plate 22 has a middle portion (not labeled) slightly lower than two lateral portions. The baffle walls 24 extend downwardly from two opposite ends of the top plate 22. The top plate 22 and the baffle walls 24 each have a width similar to a width of the fin assembly 14 such that the fan holder 20 covers the fin assembly 14. The top plate 22 defines two through holes 220 in the middle portion thereof corresponding to the thread holes 185 of the mounting plate 18. A pair of elongated tabs 26 extend perpendicularly from two opposite edges of each baffle wall 24. Each tab 26 has a length substantially equal to that of the fans 30. Each tab 26 defines a pair of threaded holes 260 at top and bottom ends thereof. The threaded holes 260 correspond to corners of the fans 30.

Each fan 30 has a square configuration and comprises a pair of parallel plates 32, 34. The plate 32 of one fan 30 is oriented to the fin assembly 14 and the plate 34 of the other fan 30 is oriented to the fin assembly 14. Four screws 30 extend through four corners of each fan 30 and threadedly engaged in the threaded holes 260 of the tabs 26 of the fan holder 20, thus attaching the fans 30 on two sides of the fan holder 20.

Referring to FIG. 2 again, in assembly of the heat dissipation device, the heat sink assembly 10 is mounted on the CPU to remove heat from the CPU. The fan holder 20 secured with two fans 30 slides from top to bottom to enclose the fin assembly 14 of the heat sink assembly 10. The baffle walls 24 of the fan holder 20 are located at two lateral ends of the fin assembly 14 to sandwich the fin assembly 14 therebetween. The fans 30 are located at two sides of the fin assembly 14 and abut respectively against inlets and outlets of the channels of the fin assembly 14. The two fans 30 rotate along a same direction. Two knurled screws 50 extend through the through holes 220 of the top plate 22 to be engaged into the thread holes 185 of the mounting plate 18 on the top of the heat sink assembly 10.

In used, the fin assembly 14 absorbs the heat from the CPU. When the fans 30 operates, airflow generated by one fan 30 flows into the channels of the fin assembly 14, and the other fan 30 sucks the heat air in the channels to take heat away therefrom. Accordingly, the heat generated by the CPU can be quickly dissipated. In the present invention, the two baffle walls 24 of the fan holder 20 sandwich the fin assembly 14 therebetween such that the airflow generated by the fans 30 can effectively flow through the fin assembly 14. Thus the heat of the heat sink assembly 10 can be timely dissipated. In addition, by the mounting plate 18 and the knurled screws 50, the fan holder 20 can be firmly and easily mounted to the top of the heat sink assembly. Thus, the assembly of the heat dissipation device is convenient.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat dissipation device comprising:
   a heat sink assembly comprising a heat spreader adapted for contacting with a heat-generating electronic component, and a fin assembly thermally connecting with the heat spreader, the fin assembly defining a plurality of channels therein, the heat sink assembly further comprising a mounting plate mounted on the fin assembly and parallel to the heat spreader;
   a fan holder having a U-shaped configuration and comprising a top plate mounted on a top of the fin assembly and a pair of vertical baffle walls extending downwardly from two opposite ends of the top plate, a length of each of the baffle walls being corresponding to a length of the fin assembly, the baffle walls of the fan holder being located at two lateral ends of the fin assembly and sandwiching the fin assembly therebetween; and
   two fans being mounted on two sides of the fan holder and respectively abutting against inlets and outlets of the channels of the fin assembly, an airflow generated by one fan flowing through the fin assembly and being sucked by the other fan;
   wherein the top plate of the fan holder is mounted on the mounting plate, the top plate defines two through holes, two knurled screws extending through the through holes of the top plate and engaging in the mounting plate.

2. The heat dissipation device as described in claim 1, wherein each of the baffle walls forms a pair of tabs from two opposite edges thereof, the fans being mounted on the tabs.

3. The heat dissipation device as described in claim 1, wherein the two fans rotate along a same direction.

4. The heat dissipation device as described in claim 1, wherein the heat sink assembly further comprises a heat pipe having an evaporation portion thermally connecting with the heat spreader and two condensation portions extending from the two opposite ends of the evaporation portion, the condensation portions extending through the fin assembly.

5. The heat dissipation device as described in claim 4, wherein the heat spreader defines a groove for receiving the evaporation portion of the heat pipe, bottom face of the evaporation portions being coplanar with a bottom face of the heat spreader adapted for cooperatively contacting the heat-generating electronic component.

6. The heat dissipation device as described in claim 5, wherein the heat pipe is U-shaped.

* * * * *